(12) United States Patent
Kang et al.

(10) Patent No.: US 7,843,716 B2
(45) Date of Patent: Nov. 30, 2010

(54) NONVOLATILE MEMORY DEVICE HAVING MEMORY AND REFERENCE CELLS

(75) Inventors: Sang-beom Kang, Hwaseong-si (KR); Woo-yeong Cho, Suwon-si (KR); Hyung-rok Oh, Yongin-si (KR); Joon-min Park, Dongjak-gu (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 323 days.

(21) Appl. No.: 12/031,085

(22) Filed: Feb. 14, 2008

(65) Prior Publication Data

US 2008/0198645 A1      Aug. 21, 2008

(30) Foreign Application Priority Data

Feb. 16, 2007   (KR) .................. 10-2007-0016342

(51) Int. Cl.
*G11C 5/02* (2006.01)
(52) U.S. Cl. .............. 365/51; 365/210; 365/189.15; 365/148
(58) Field of Classification Search .......... 365/210.1, 365/148, 189.15, 51, 129, 171, 173
See application file for complete search history.

(56) References Cited

U.S. PATENT DOCUMENTS 6,359,829 B1 * 3/2002 Van Den Berg ............. 365/232
6,646,912 B2 * 11/2003 Hurst et al. .................. 365/175
7,009,278 B2 3/2006 Hsu
2006/0067149 A1 * 3/2006 Shimizu et al. ............. 365/210

FOREIGN PATENT DOCUMENTS

| JP | 2005136071 | 5/2005 |
| JP | 2005260014 | 9/2005 |
| JP | 2006-294206 | 10/2006 |
| KR | 1020040066420 A | 7/2004 |
| KR | 10-2005-0107813 | 11/2005 |

* cited by examiner

*Primary Examiner*—Pho M Luu
*Assistant Examiner*—Tha-o Bui
(74) *Attorney, Agent, or Firm*—Volentine & Whitt, P.L.L.C.

(57) ABSTRACT

A nonvolatile memory device includes a stack-type memory cell array, a selection circuit and a read circuit. The memory cell array includes multiple memory cell layers and a reference cell layer, which are vertically laminated. Each of the memory cell layers includes multiple nonvolatile memory cells for storing data, and the reference cell layer includes multiple reference cells for storing reference data. The selection circuit selects a nonvolatile memory cell from the memory cell layers and at least one reference cell, corresponding to the selected nonvolatile memory cell, from the reference cell layer. The read circuit supplies a read bias to the selected nonvolatile memory cell and the selected reference cell corresponding to the selected nonvolatile memory cell, and reads data from the selected nonvolatile memory cell.

19 Claims, 12 Drawing Sheets

NONVOLATILE MEMORY DEVICE HAVING MEMORY AND REFERENCE CELLS

CROSS-REFERENCE TO RELATED APPLICATION

A claim of priority is made to Korean Patent Application No. 10-2007-0016342 filed on Feb. 16, 2007, the subject matter of which is hereby incorporated by reference.

BACKGROUND OF THE INVENTION

1. Field of the Invention

The present invention relates to a nonvolatile memory device having memory cells and corresponding reference cells.

2. Description of the Related Art

Examples of nonvolatile memory devices using resistance material include resistive random access memory (RRAM) devices, phase change random access memory (PRAM) devices, magnetic random access memory (MRAM) devices, and the like. Dynamic random access memory (DRAM) devices or flash memory devices store data by charges, while the nonvolatile memory devices using resistance material store data by changing the resistance of a variable resistance material (corresponding to RRAM), changing the state of a phase change material, such as a chalcogenide alloy (corresponding to PRAM), changing the resistance of a magnetic tunnel junction (MTJ) thin film according to a magnetization state of a ferromagnetic material (corresponding to MRAM), and the like.

Resistive memory cells include variable resistance material provided between an upper electrode and a lower electrode, and the resistance level of the variable resistance material changes according to a voltage applied to the upper and lower electrodes. In particular, a filament that serves as a current path of a cell current is formed in the variable resistance material. A state in which a part of the filament is disconnected is defined as a reset state, a high resistance state, and reset data (data 1). A state in which the filament is connected is defined as a set state, a low resistance state, and set data (data 0).

A reset voltage, which has a voltage level at which the filament may be disconnected, is supplied to write reset data into the resistive memory cells. A set voltage, which has a voltage level at which the filament may be reconnected, is supplied to write set data into the resistive memory cells. Further, a voltage that has a low voltage level at which the state of the filament does not change is supplied to read the stored data to determine whether the read data is reset data or set data.

SUMMARY OF THE INVENTION

According to one aspect of the present invention, there is provided a nonvolatile memory device, including a stack-type memory cell array having multiple memory cell layers and a reference cell layer that are vertically laminated. Each memory cell layer includes multiple nonvolatile memory cells for storing data and the reference cell layer includes multiple reference cells for storing reference data. A selection circuit selects a nonvolatile memory cell from the memory cell layers and at least one reference cell, corresponding to the selected nonvolatile memory cell, from the reference cell layer. A read circuit supplies a read bias to each of the selected nonvolatile memory cell and the selected reference cell corresponding to the selected nonvolatile memory cell. The read circuit also reads data from the selected nonvolatile memory cell. Each of the nonvolatile memory cells may be a resistive memory cell. Also, each of the memory cell layers and the reference cell layer may be a cross point structure.

The read circuit may compare a first bias level varying according to a cell current flowing through the selected nonvolatile memory cell and a second bias level varying according to a cell current flowing through the selected at least one reference cell, and output the compared result. Also, the read circuit may include a first current mirror circuit coupled to the selected nonvolatile memory cell, a second current mirror circuit coupled to the selected at least one reference cell, and a sense amplifier coupled to the first current mirror circuit and the second current mirror circuit. With respect to the selected at least one reference cell, the selection circuit may select a first reference cell storing first reference data having a first resistance state and a second reference cell storing second reference data having a second resistance state. The cell current flowing through the selected at least one reference cell may include a sum of a first cell current flowing through the selected first reference cell and a second cell current flowing through the selected second reference cell.

According to another aspect of the present invention, there is provided a nonvolatile memory device, including a memory cell array, a selection circuit and a read circuit. The memory cell array includes multiple nonvolatile memory cells for storing data, multiple first reference cells for storing first reference data having a first resistance state, and multiple second reference cells for storing second reference data having a second resistance state. The selection circuit selects a nonvolatile memory cell from the nonvolatile memory cells, and selects a first reference cell from the first reference cells and a second reference cell from the second reference cells. The read circuit supplies a read bias to each of the selected nonvolatile memory cell, the selected first reference cell and the selected second reference cell, and reads data from the selected nonvolatile memory cell.

BRIEF DESCRIPTION OF THE DRAWINGS

The embodiments of the present invention will be described with reference to the attached drawings, in which.

DETAILED DESCRIPTION OF THE EMBODIMENTS

Figure 1:
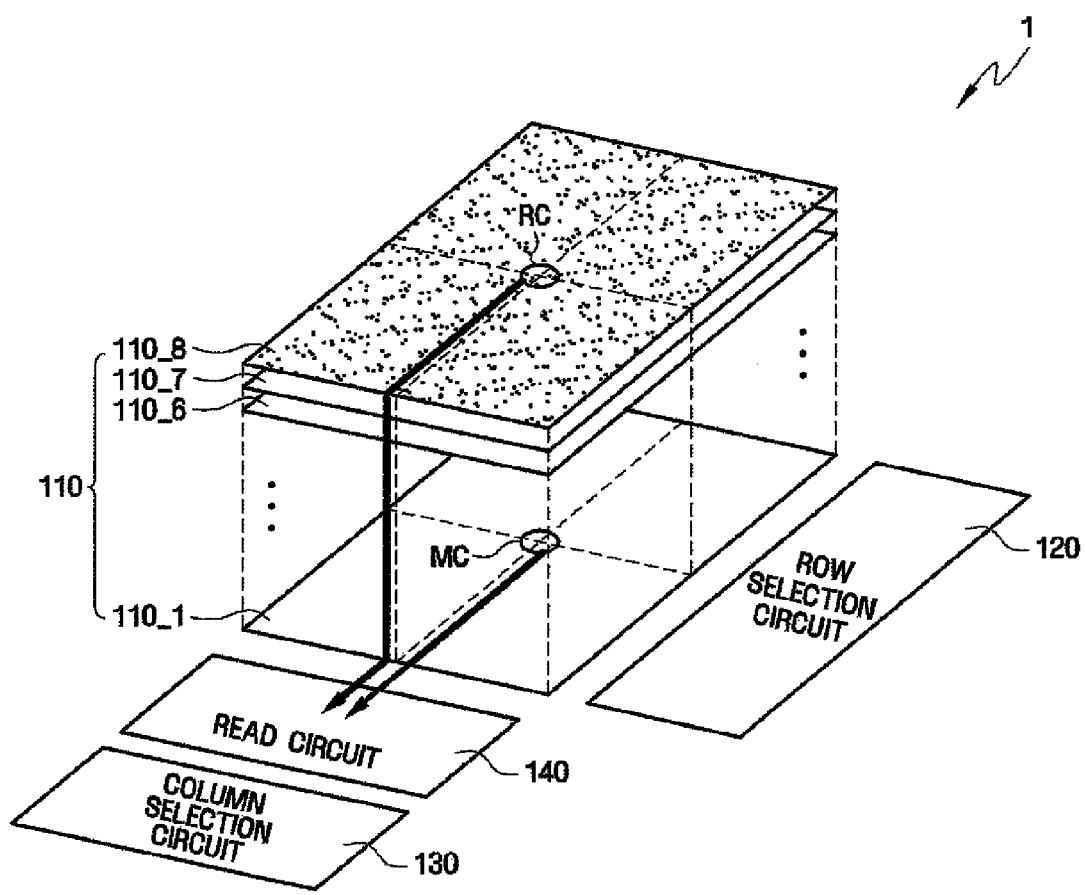
FIG. 1 is a block diagram illustrating a nonvolatile memory device, according to embodiments of the present invention.

The present invention will now be described more fully with reference to the accompanying drawings, in which illustrative embodiments of the invention are shown. The invention, however, may be embodied in various different forms, and should not be construed as being limited only to the illustrated embodiments. Rather, these embodiments are provided as examples, to convey the concept of the invention to one skilled in the art. Accordingly, known processes, elements, and techniques are not described with respect to some of the embodiments of the present invention. Throughout the drawings and written description, like reference numerals will be used to refer to like or similar elements.

It will be understood that when an element is referred to as being "connected to" or "coupled to" another element, the element can be directly connected or coupled to the other element or intervening elements that may be present. In contrast, when an element is referred to as being "directly connected to" or "directly coupled to" another element, there are no intervening elements present. As used herein, the term "and/or" includes any and all combinations of one or more of the associated listed items.

It will be understood that, although the terms first, second, etc., may be used herein to describe various elements, components, and/or sections, these elements, components, and/or sections should not be limited by these terms. These terms are only used to distinguish one element, component or section from another element, component, or section. Thus, for example, a first element, component, or section discussed below could be termed a second element, component, or section without departing from the spirit and scope of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated components, steps, operations, and/or elements, but do not preclude the presence or addition of one or more other components, steps, operations, and/or elements.

In addition, when terms used in this specification are not specifically defined, all the terms used in this specification (including technical and scientific terms) can be understood by those skilled in the art. Further, when general terms defined in the dictionaries are not specifically defined, the terms will have the normal meaning in the art.

Positional terminology, such as below, beneath, lower, above, upper, and the like, may be used to conveniently describe elements and components, or positional relationships between elements and/or components shown in drawings. It is understood, however, that such terminologies are intended for convenience of explanation, and may include other positions or relationships that the elements or components may assume during usage and operation, in addition to the positions and relationships shown in the drawings. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein should be interpreted accordingly.

Hereinafter, a description will be made of illustrative embodiments of the present invention by referencing resistive random access memory (RRAM) devices. However, it will be understood by those skilled in the art that the present invention can be applied to other nonvolatile memory devices, such as phase change random access memory (PRAM) devices, ferroelectric RAM (FRAM) devices, magnetic RAM (MRAM) devices, and the like, which use resistance materials, without departing from the spirit and scope of the present invention.

Illustrative embodiments of the present invention will be described hereinafter with reference to block diagrams or flowchart illustrations of nonvolatile memory devices using variable resistive elements.

FIG. 1 is a block diagram illustrating a nonvolatile memory device according to embodiments of the present invention. Referring to FIG. 1, a nonvolatile memory device 1 includes a stack-type memory cell array 110, a row selection circuit 120, a column selection circuit 130, and a read circuit 140.

The stack-type memory cell array 110 has a structure in which multiple memory cell layers 110_1 to 110_7 and a reference cell layer 110_8 are vertically laminated. Although FIG. 1 depicts an example in which the eight layers 110_1 to 110_8 are laminated, the present invention is not limited to this number of layers. In the depicted embodiment, the memory cell layers 110_1 to 110_7 include nonvolatile memory cells MC that store predetermined data, and the reference cell layer 110_8 includes multiple reference cells RC that store reference data. In an embodiment, the reference cells RC may have the same structure as the nonvolatile memory cells MC, except that the reference cells RC store reference data used by the read circuit 140 during a read operation.

Figure 2:
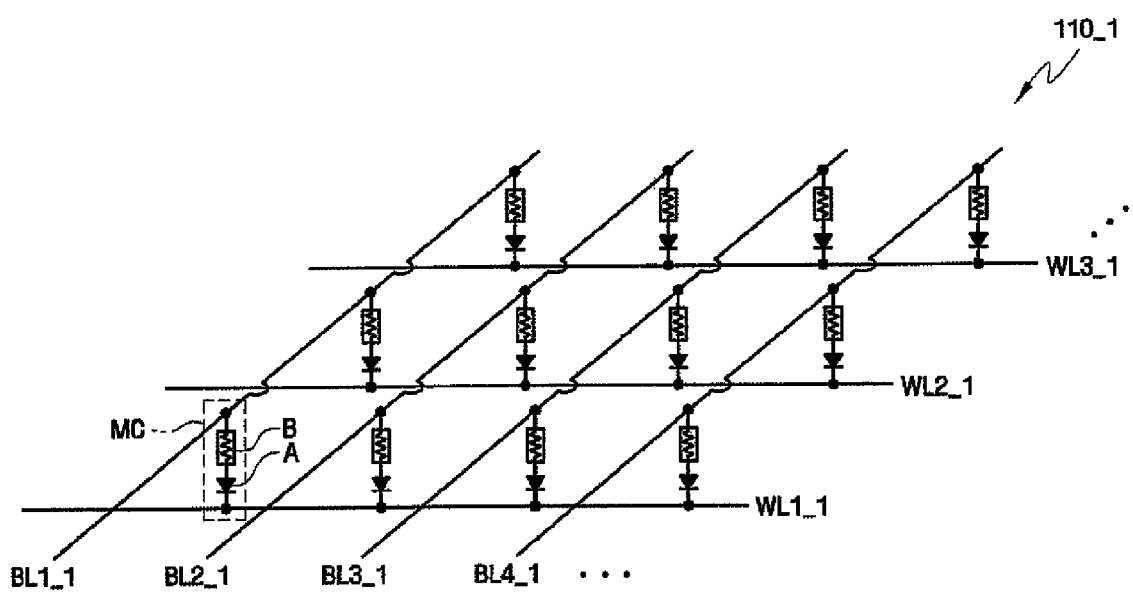
FIG. 2 is a circuit diagram illustrating an example of a layer shown in FIG. 1.

Further, each of the memory cell layers 110_1 to 110_7 and the reference cell layer 110_8 may have a cross point structure, an example of which is shown in FIG. 2, which illustrates a layer shown in FIG. 1. The cross point structure refers to a structure in which one memory cell is formed in a region where a line and another line cross each other. In FIG. 2, for convenience of explanation, only the memory cell layer 110_1 is shown. In the memory cell layer 110_1, bit lines BL1_1 to BL4_1 and word lines WL1_1 to WL3_1 are formed to intersect, and the nonvolatile memory cells MC are formed in the regions where the bit lines BL1_1 to BL4_1 and the word lines WL1_1 to WL3_1 cross.

The nonvolatile memory cell MC may be, for example, a resistive memory cell. In this case, each of the nonvolatile memory cells MC may include a variable resistive element B and an access element A that are connected in series to each other. The variable resistive element B may include, for example, NiO or perovskite. The perovskite may be a combination of manganite ($Pr_{0.7}Ca_{0.3}MnO_3$, $Pr_{0.5}Ca_{0.5}MnO_3$, PCMO, LCMO, or the like), titanate (STO:Cr), zirconate (SZO:Cr, $Ca_2Nb_2O_7$:Cr, and $Ta_2O_5$:Cr), or the like. In particular, a filament is formed in the variable resistive element B, which serves as a current path of a cell current that flows through the nonvolatile memory cell MC. The access element A is exemplified as a diode in the drawing, but the present invention is not limited thereto.

Figure 3:
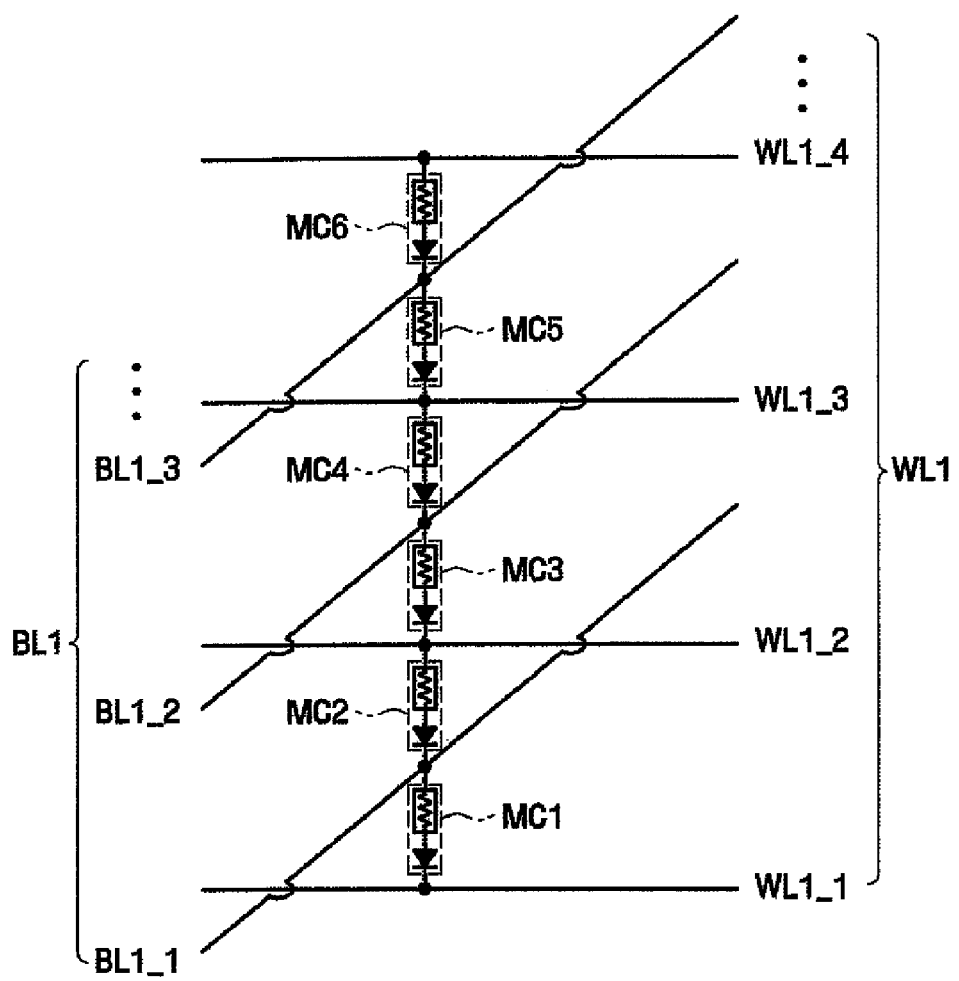
FIG. 3 is a circuit diagram illustrating an example of layers shown in FIG. 1.

The laminated layers will be described with reference to FIG. 3, which illustrates an example of the layers in FIG. 1. In FIG. 3, for convenience of explanation, only nonvolatile memory cells MC1 to MC6 are described as examples.

Memory cells MC1 to MC6 are formed to be laminated in regions in which the bit lines BL1 (i.e., BL1_1 to BL1_3) and the word lines WL1 (that is, WL1_1 to WL1_4) intersect. For example, the nonvolatile memory cell MC1 is formed between the word line WL1_1 and the bit line BL1_1. The nonvolatile memory cell MC1 is included in the first nonvolatile memory cell layer 110_1, which corresponds to a lowermost memory cell layer. Further, the nonvolatile memory cell MC2 is formed between the bit line BL1_1 and the word line WL1_2. The nonvolatile memory cell MC2 is included in a second nonvolatile memory cell layer 110_2. In the same manner, the nonvolatile memory cell MC3, the nonvolatile memory cell MC4, the nonvolatile memory cell MC5, and the nonvolatile memory cell MC6 are included in the third nonvolatile memory cell layer 110_3, the fourth nonvolatile memory cell layer 110_4, the fifth nonvolatile memory cell layer 110_5, and the sixth nonvolatile memory cell layer 110_6, respectively.

Figure 4:
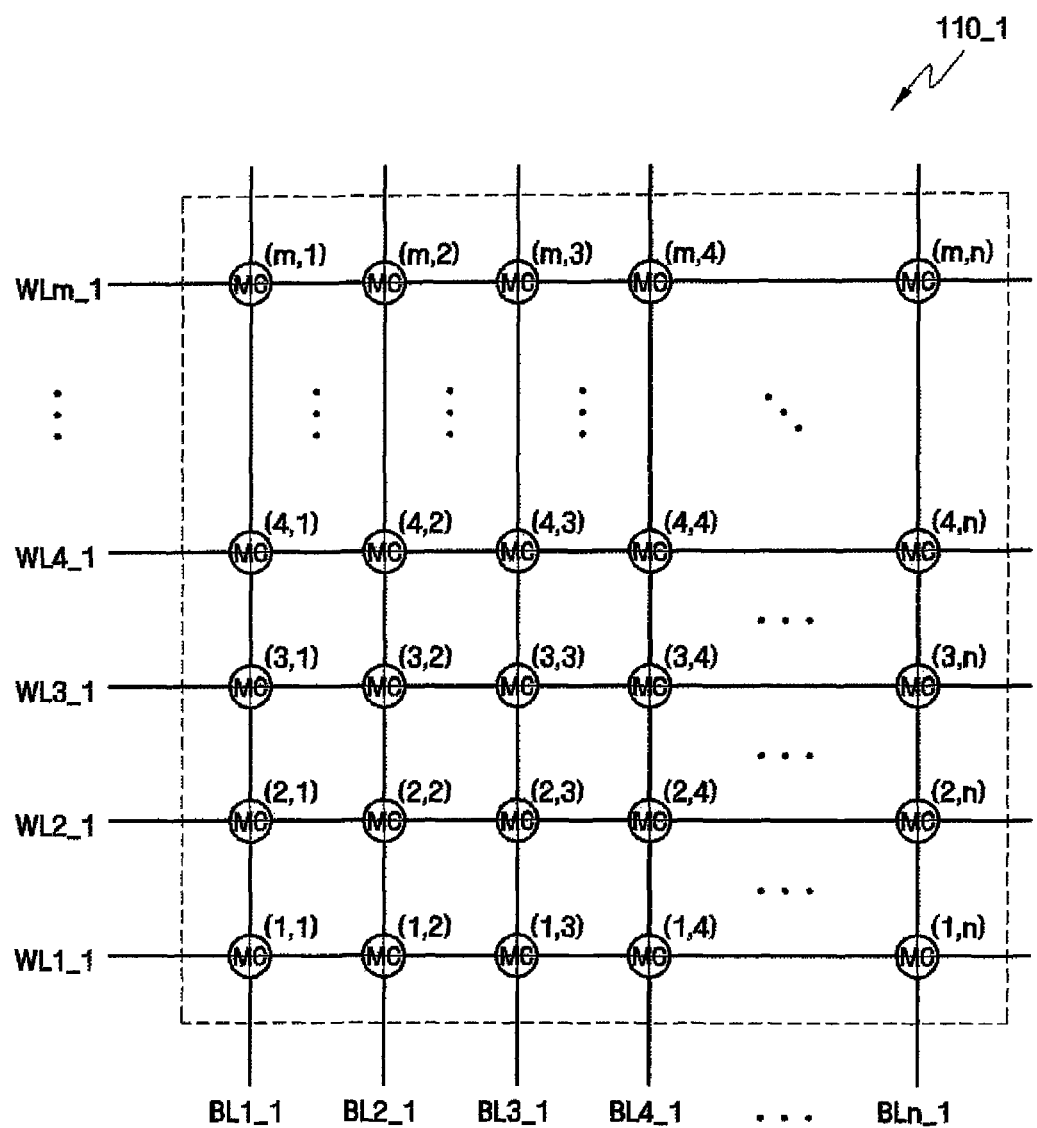
FIG. 4 is a diagram illustrating coordinates of layers shown in FIG. 1.

In embodiments of the present invention, coordinates can indicate the locations of the nonvolatile memory cells MC or the reference cells RC included in the cell layers. As shown in FIG. 4, which illustrates coordinates of the illustrative layers shown in FIG. 1, the various cells are represented by the coordinates (x, y) of each layer (where x and y are natural numbers). For example, with respect to the first nonvolatile memory cell layer 110_1, the x coordinate indicates the word lines WL1_1 to WLm_1 coupled to the nonvolatile memory cells MC or the reference cells RC, and the y coordinate indicates the bit lines BL1_1 to BLn_1 coupled to the nonvolatile memory cells MC or the reference cells RC. For example, a nonvolatile memory cell MC located at the coordinates (1, 1) is coupled to the word line WL1_1 and the bit line BL1_1, a nonvolatile memory cell MC located at the coordinates (3, 3) is coupled to the word line WL3_1 and the bit line BL3_1, and a nonvolatile memory cell MC located at the coordinates (m, n) (where m and n are natural numbers) is coupled to the word line WLm_1 and the bit line BLn_1.

The reference data that is stored in the reference cell layer 110_8 may be stored in various types. For example, the reference cell layer 110_8 may include multiple first reference cells in which reference data of a first resistance state (for example, a high resistance state, reset data or data 1) are stored, and multiple second reference cells in which reference data of a second resistance state (for example, a low resistance state, set data or data 0) are stored.

Figure 5A:
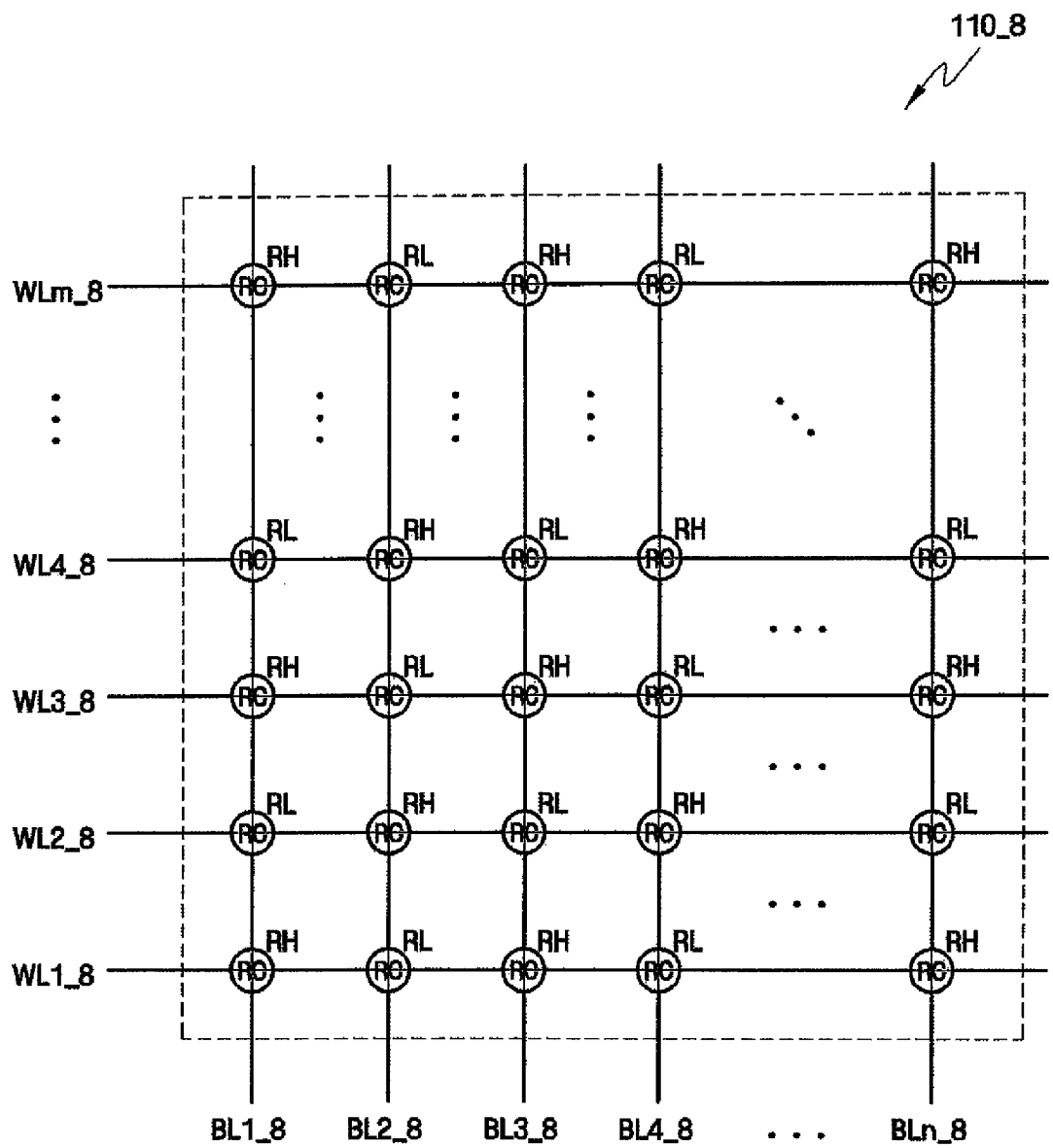
FIGS. 5A to 5C are diagrams illustrating examples of reference data stored in a reference layer, according to embodiments of the present invention.

For example, FIG. 5A illustrates reference data stored in the illustrative reference cell layer 110_8 shown in FIG. 1. The first reference cells, in which reference data RH having a high resistance state are stored, and the second reference cells, in which reference data RL having a low resistance state are stored, may be arranged in a checkerboard pattern. In this case, the checkerboard pattern refers to a pattern in which the first and second reference cells are alternately disposed, such that the second reference cells are positioned around a first reference cell (that is, adjacent to the upper, lower, left and right sides of the first reference cell) and the first reference cells are positioned around a second reference cell. For example, as shown in FIG. 5A, the reference cell RC located at the coordinates (3, 3) is at a high resistance state, and each reference cell RC positioned around the reference cell RC located at the coordinates (3, 3), having the respective coordinates (4, 3), (2, 3), (3, 2) and (3, 4), are at a low resistance state.

Figure 5B:
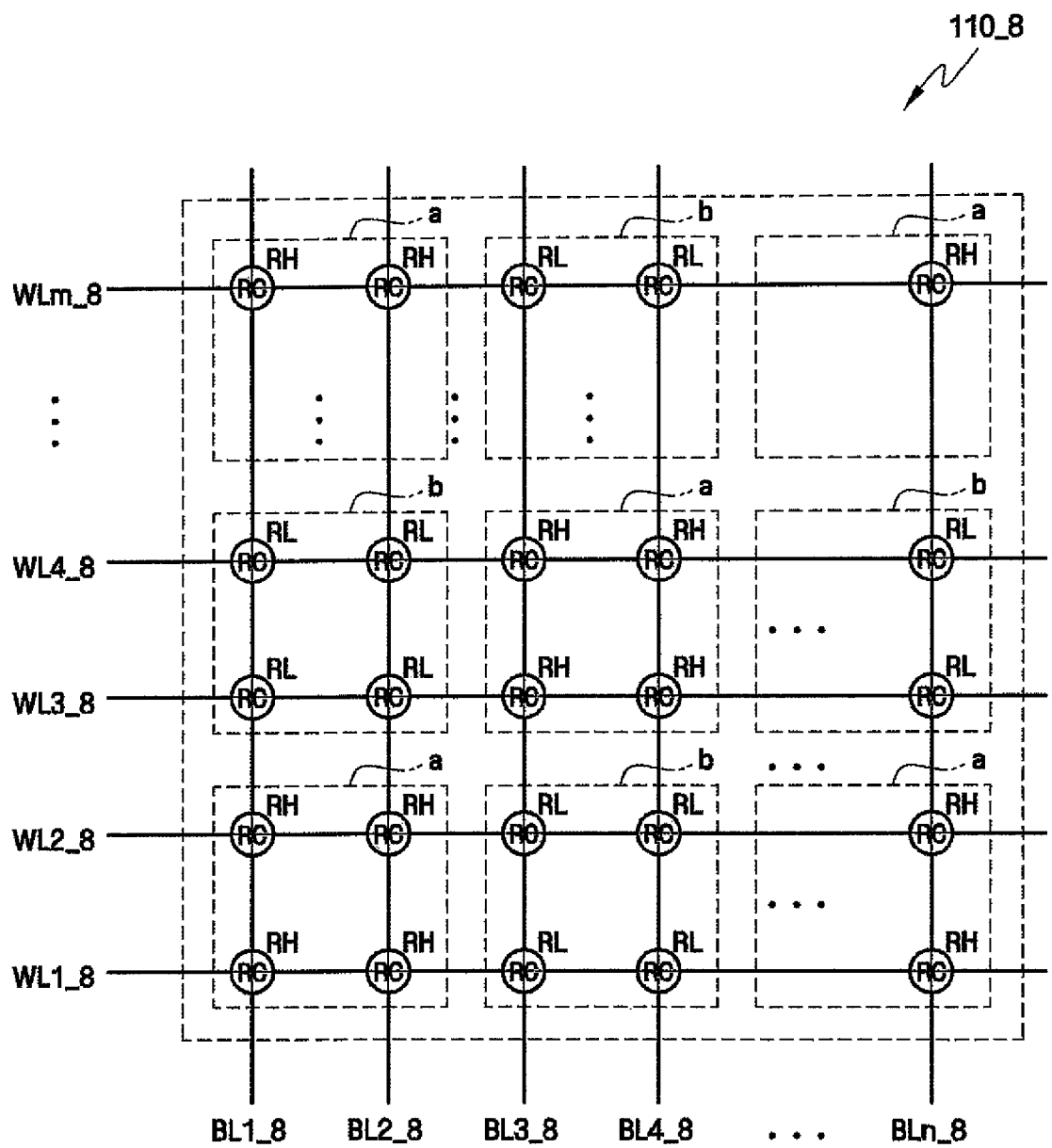
Figure 5C:
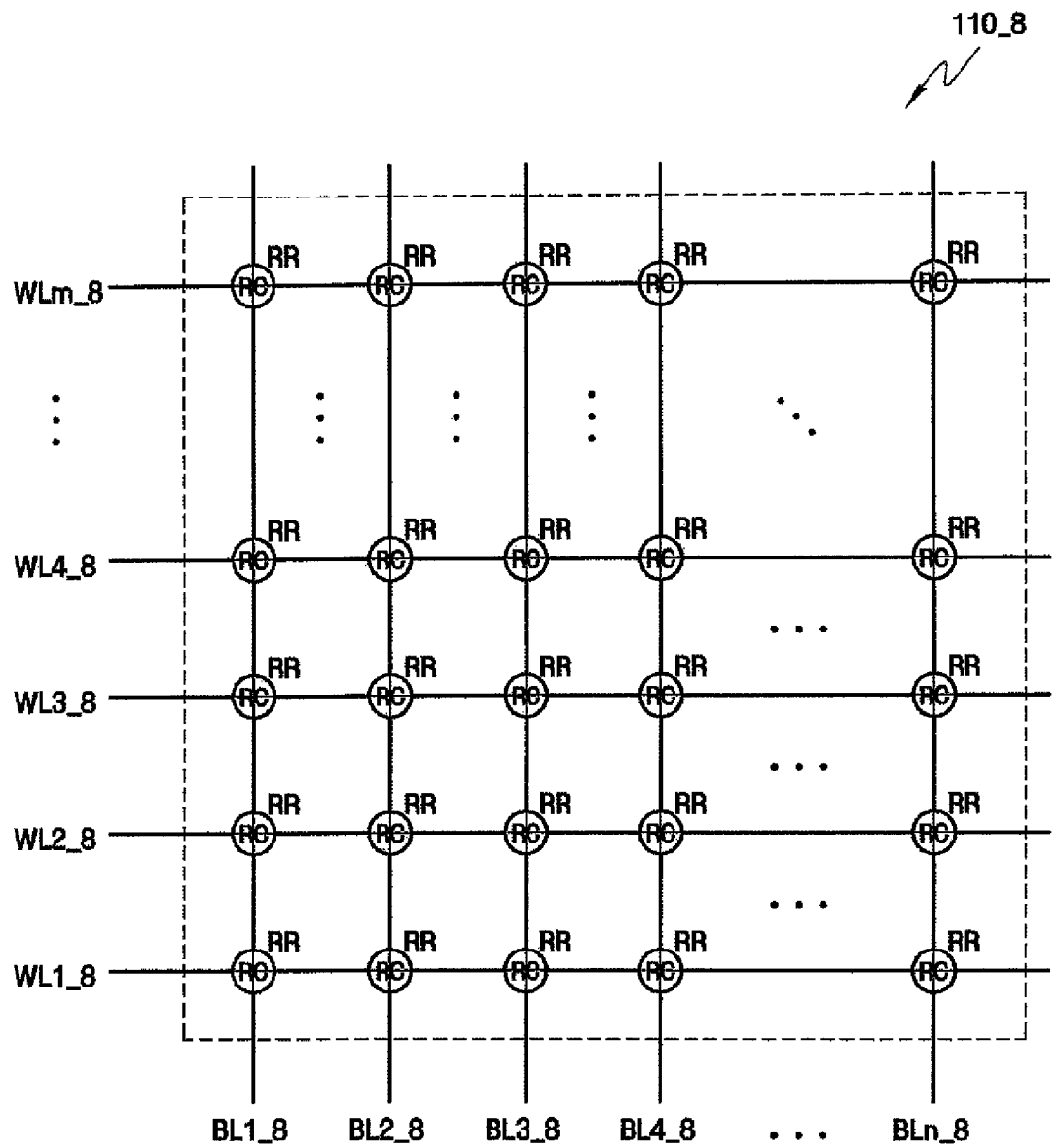

As another example, FIG. 5B illustrates a first reference cell group a, consisting of four reference cells RC in which reference data RH having a first resistance state are stored, and a second reference cell group b, consisting of four adjacent reference cells RC in which reference data RL of a second resistance state are stored. The cell groups may be alternatively disposed in a checkerboard pattern. FIG. 5C shows another example, in which each of the reference cells RC of the reference cell layer 110_8 may store reference data RR of a third resistance state (for example, the average resistance between high resistance and low resistance).

Notably, the reference cell layer 110_8 is exemplified in FIG. 1 as a layer located at the highest point among the multiple layers of the stack-type memory cell array 110 (i.e., above the seventh nonvolatile memory cell layer 110_7). However, this arrangement is for purposes of illustration only, and the embodiments of the present invention are not limited thereto. For example, the reference cell layer 110_8 may be situated as an inner or middle layer among the multiple layers (i.e., between two nonvolatile memory cell layers).

Referring to FIG. 1 again, the row selection circuit 120 decodes a row address to select a predetermined word line, and the column selection circuit 130 decodes a column address to select a predetermined bit line. In this manner, the row and column selection circuits 120 and 130 select the predetermined nonvolatile memory cell MC from the memory cell layers 110_1 to 110_7, and select the reference cell RC corresponding to the selected nonvolatile memory cell MC in the reference cell layer 110_8.

When the reference cell layer 110_8 includes multiple first reference cells storing reference data RH of a first resistance state and multiple second reference cells storing reference data RL of a second resistance state (shown, for example, in FIGS. 5A and 5B), then both a first reference cell and a second reference cell correspond to the selected nonvolatile memory cell MC. In this case, the row and column selection circuits 120 and 130 may select one first reference cell from among the first reference cells and one second reference cell from among the second reference cells. For example, the selection circuits 120 and 130 select the nonvolatile memory cell MC having first coordinates from the memory cell layers 110_1 to 110_7, and select a first reference cell RC having the first coordinates and a second reference cell having second coordinates different from the first coordinates from the reference cell layer 110_8. The reference data stored in the selected first reference cell (having the first coordinates) is different from the reference data stored in the selected second reference cell (having the second coordinates), which will be described in detail below with reference to FIGS. 6 and 8.

When the reference cell layer 110_8 includes third reference cells, which store reference data of a third resistance state (shown, for example, in FIG. 5C), one reference cell corresponds to the selected nonvolatile memory cell MC. The row and column selection circuits 120 and 130 may therefore select one third reference cell from among the third reference cells, which will be described in detail below with reference to FIG. 9.

The read circuit 140 supplies a read bias to each of the selected nonvolatile memory cell MC and the reference cell(s) RC corresponding to the selected nonvolatile memory cell MC, and reads data from the selected nonvolatile memory cell. More particularly, the read circuit 140 may compare a first bias level varying according to a cell current flowing through the selected nonvolatile memory cell MC and a second bias level varying according to a cell current flowing through each selected reference cell RC. The read circuit 140 outputs the compared result.

For example, when the row and column selection circuits 120 and 130 select one first reference cell from among the multiple first reference cells and one second reference cell from among the multiple second reference cells (shown, for example, FIGS. 5A and 5B), the read circuit 140 compares a first bias level varying according to a cell current flowing through the selected nonvolatile memory cell MC and a second bias level varying according to a cell current flowing through the two selected reference cells RC. Examples of read circuits will be described below with reference to FIGS. 7 and 10.

Figure 6:
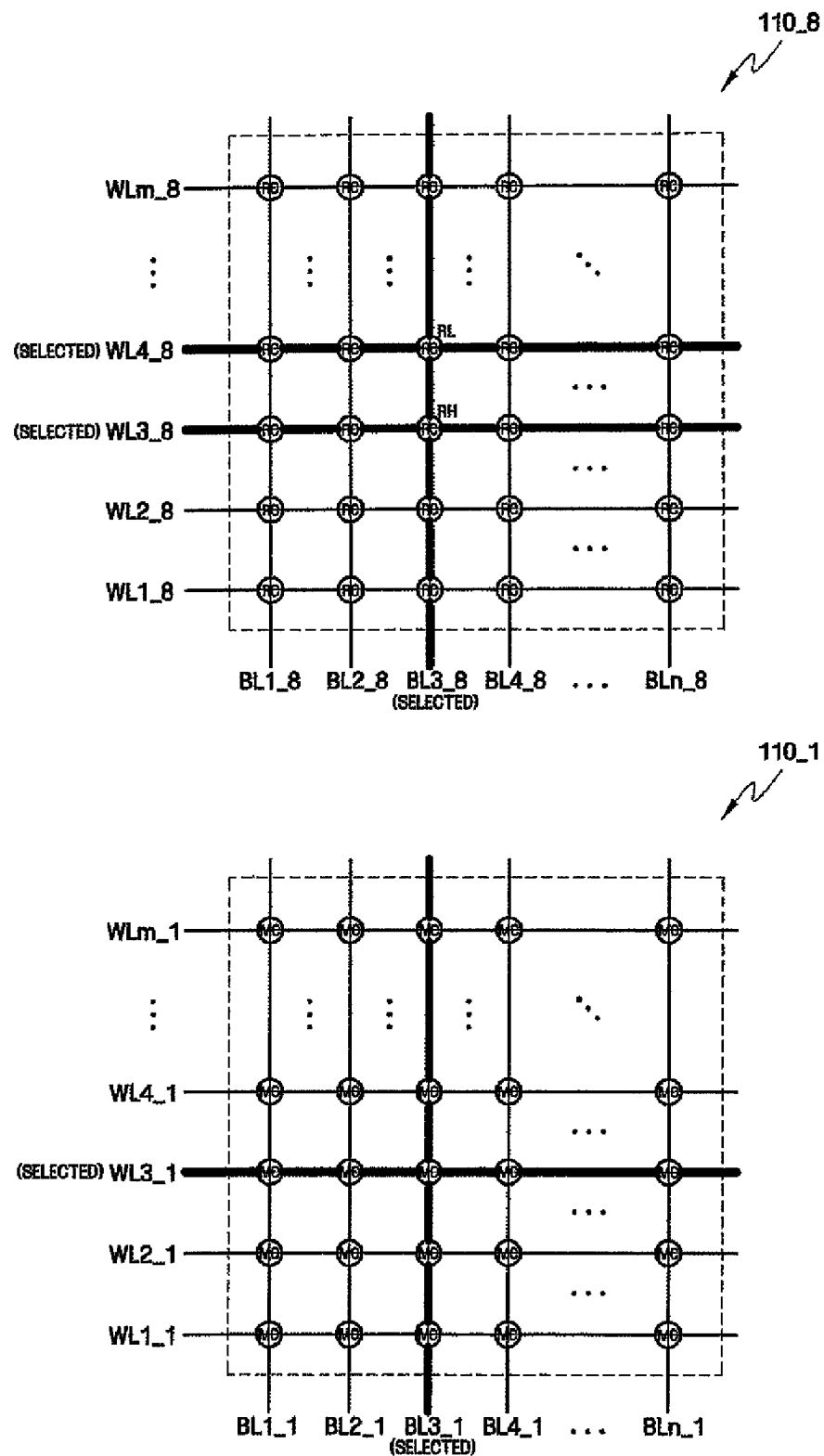
FIG. 6 is a conceptual diagram illustrating a nonvolatile memory device, according to an embodiment of the present invention.
Figure 7:
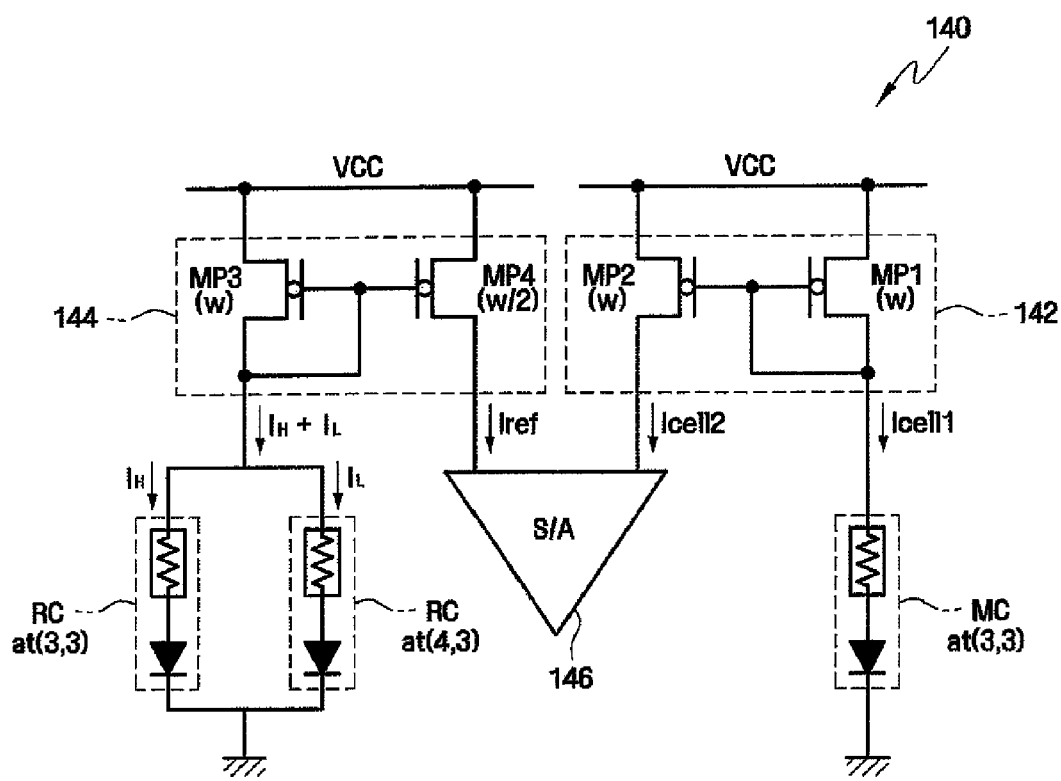
FIG. 7 is a circuit diagram illustrating a read circuit used in a nonvolatile memory device, according to an embodiment of the present invention.

FIG. 6 is a conceptual diagram illustrating a nonvolatile memory device according to an illustrative embodiment of the present invention. FIG. 6 illustrates a method of selecting a reference cell that corresponds to a selected nonvolatile memory cell, when reference data stored in a reference cell layer is the same as shown in FIG. 5A. FIG. 7 is a circuit diagram illustrating a read circuit used in the nonvolatile memory device according to the embodiment depicted FIG. 6, for example.

First, referring to FIG. 6, when multiple first reference cells storing reference data RH of a first resistance state and multiple second reference cells storing reference data RL of a second resistance state are arranged in a checkerboard pattern, the row and column selection circuits 120 and 130 can select one of the first reference cells and one of second reference cells. Specifically, the row and column selection circuits 120 and 130 may select a nonvolatile memory cell MC having the coordinates (x, y) (where x and y are natural numbers) from the memory cell layer (for example, memory cell layer 110_1), and select a reference cell RC having the coordinates (x, y) and a reference cell RC having the coordinates (x+1, y) or (x−1, y) from the reference cell layer 110_8. For example, as shown in FIG. 6, when the row and column selection circuits 120 and 130 select a nonvolatile memory cell MC having the coordinates (3, 3) from the memory cell layers 110_1 to 110_7, the row and column selection circuits 120 and 130 may select reference cells RC having the coordinates (3, 3) and (4, 3) from the reference cell layer 110_8. Also, the row and column selection circuits 120 and 130 alternatively may select a reference cell having the coordinates (2, 3), for example, instead of the reference cell having the coordinates (4, 3).

Here, it can be understood that the coordinates of the nonvolatile memory cell MC selected from the memory cell layers 110_1 to 110_7 are the same as or similar to the coordinates of the first and second reference cells RC selected from the reference cell layer 110_8. This is because the length of a bit line from the selected nonvolatile memory cell MC to the read circuit 140, and the length of a word line from the selected nonvolatile memory cell MC to a ground line (not shown) depend on the coordinates of the nonvolatile memory cell MC selected from the memory cell layers 110_1 to 110_7.

Accordingly, during a read operation, a resistance value of the nonvolatile memory cell MC calculated by the read circuit 140 changes slightly according to the coordinates of the nonvolatile memory cell MC selected from the memory cell layers 110_1 to 110_7. The coordinates of the reference cell RC selected from the reference cell layer 110_8 are set to be the same as or similar to the coordinates of the selected nonvolatile memory cell MC, addressing he issues described above. In other words, a sensing margin and reliability in a read operation are can be improved. However, when the sensing margin is sufficiently increased, the coordinates of the reference cell RC in the reference cell layer 110_8 and the coordinates of the nonvolatile memory cell MC in the memory cell layers 110_1 to 110_7 are not necessarily set to be the same as or similar to each other.

Meanwhile, according to the memory cell layers 110_1 to 110_7 where the selected nonvolatile memory cell MC is located, a resistance value of the nonvolatile memory cell MC calculated by the read circuit 140 may change slightly. However, the vertical location (that is, the location of the memory cell layers 110_1 to 110_7 which includes the selected nonvolatile memory cell MC) affects the sensing margin during a read operation less than the horizontal location (that is, the location of the selected nonvolatile memory cell MC within the memory cell layer) because the height of the vertically laminated stack-type memory cell array 110 is much less than the length of each of the memory cell layers 110_1 to 110_7 in a horizontal direction. In order to reduce the influence resulting from the vertical location, the reference cell layer 110_8 may be positioned as an inner or middle layer among the multiple layers.

FIG. 7 is a circuit diagram illustrating a read circuit used in a nonvolatile memory device, according to an illustrative embodiment of the present invention. Referring to FIG. 7, the read circuit 140 includes a first current mirror circuit 142, a second current mirror circuit 144, and a sense amplifier 146.

The first current mirror circuit 142 includes a first current path Icell1 coupled to the selected nonvolatile memory cell MC and a second current path Icell2 coupled to the sense amplifier 146. A PMOS transistor MP1 on the first current path Icell1 and a PMOS transistor MP2 on the second current path Icell2 may be the same in current driving capability and size, which means generally that widths of the PMOS transistors MP1 and MP2 are the same, assuming that the lengths of the PMOS transistors MP1 and MP2 are the same.

The second current mirror circuit 144 includes a third current path $I_H+I_L$ coupled to the selected first and second reference cells RC and a fourth current path Iref coupled to the sense amplifier 146. The size of a PMOS transistor MP4 on the fourth current path may be about half the size of a PMOS transistor MP3 on the third current path. For example, a width W of the PMOS transistor MP4 may be half a width W of the PMOS transistor MP3. Accordingly, a current flowing through the fourth current path Iref may be half of the current flowing through the third current path $I_H+I_L$.

The sense amplifier 146, coupled to the first and second current mirror circuits 142 and 144, compares a level of a current flowing through the second current path Icell2 and a level of a current flowing through the fourth current path Iref, and outputs the compared result (not shown). In this manner, the read circuit 140 may provide a comparison between a first bias level varying according to a cell current flowing through the selected nonvolatile memory cell MC and a second bias level varying according to a cell current flowing through each selected reference cell RC.

In the depicted embodiment, the sense amplifier 146 is exemplified as a current-type sense amplifier, although the present invention is not limited thereto. For example, the sense amplifier 146 according to other embodiments of the present invention may be a voltage-type sense amplifier, without departing from the spirit and scope of the present invention.

Figure 8:
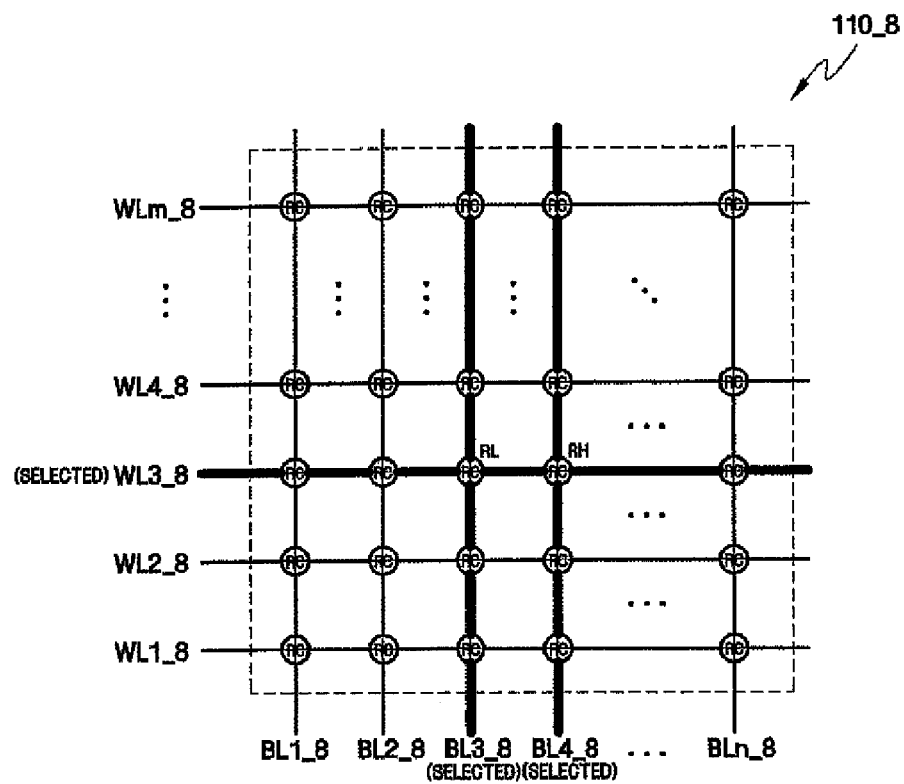
FIG. 8 is a conceptual diagram illustrating a nonvolatile memory device, according to another embodiment of the present invention.
Figure 8:
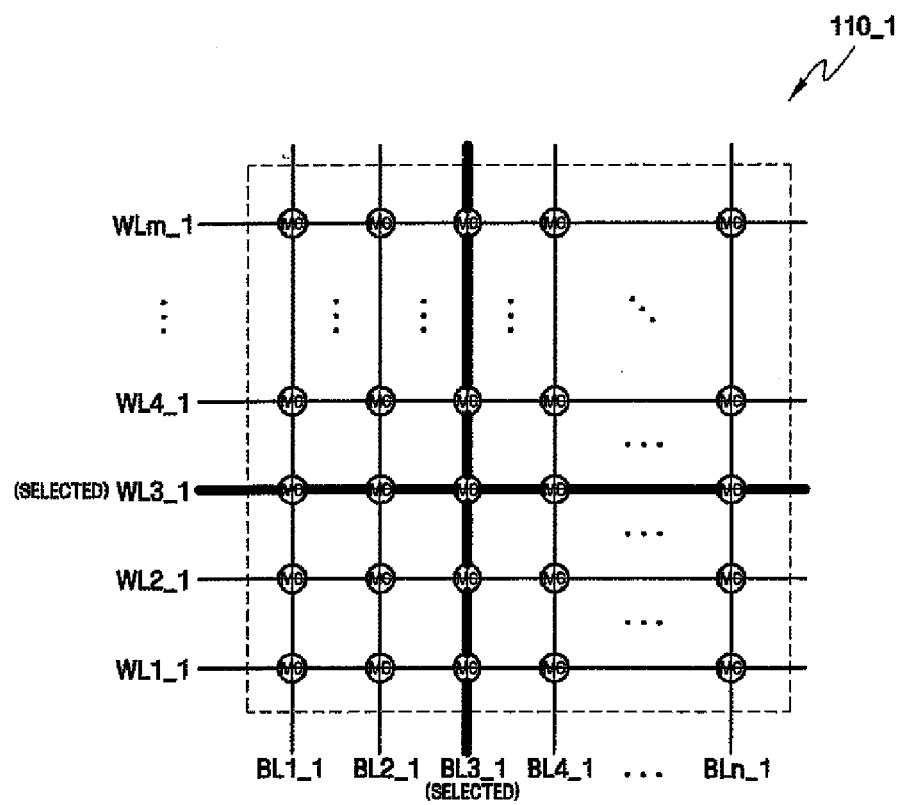

FIG. 8 is a conceptual diagram illustrating a nonvolatile memory device according to an illustrative embodiment of the present invention. FIG. 8 illustrates a method of selecting a reference cell corresponding to a selected nonvolatile memory cell MC, when reference data stored in a reference cell layer is the same as shown in FIG. 5A.

Referring to FIG. 8, the row and column selection circuits may select a nonvolatile memory cell having the coordinates (x, y) (where x and y are natural numbers) from the predetermined memory cell layer, and select a reference cell having the coordinates (x, y) and a reference cell RC having the coordinates (x, y+1) or (x, y−1) from the reference cell layer.

For example, as shown in FIG. 8, when the row and column selection circuits 120 and 130 select the nonvolatile memory cell MC located at the coordinates (3, 3) from the memory cell layers 110_1 to 110_7, the row and column selection circuits 120 and 130 may select a reference cell RC located at the coordinates (3, 3) and a reference cell RC located at the coordinates (3, 4) from the reference cell layer 110_8. Also, the row and column selection circuits 120 and 130 may alternatively select a reference cell RC located at the coordinates (3, 2), for example, instead of the reference cell having the coordinates (3, 4).

Figure 9:
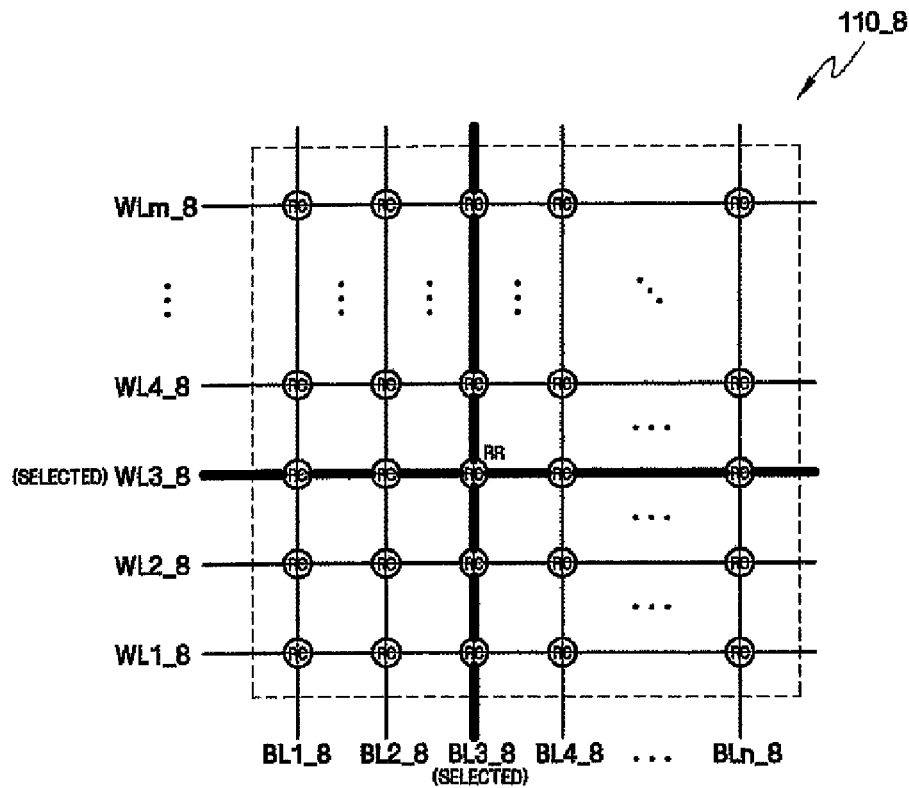
FIG. 9 is a conceptual diagram illustrating a nonvolatile memory device, according to another embodiment of the present invention.
Figure 9:
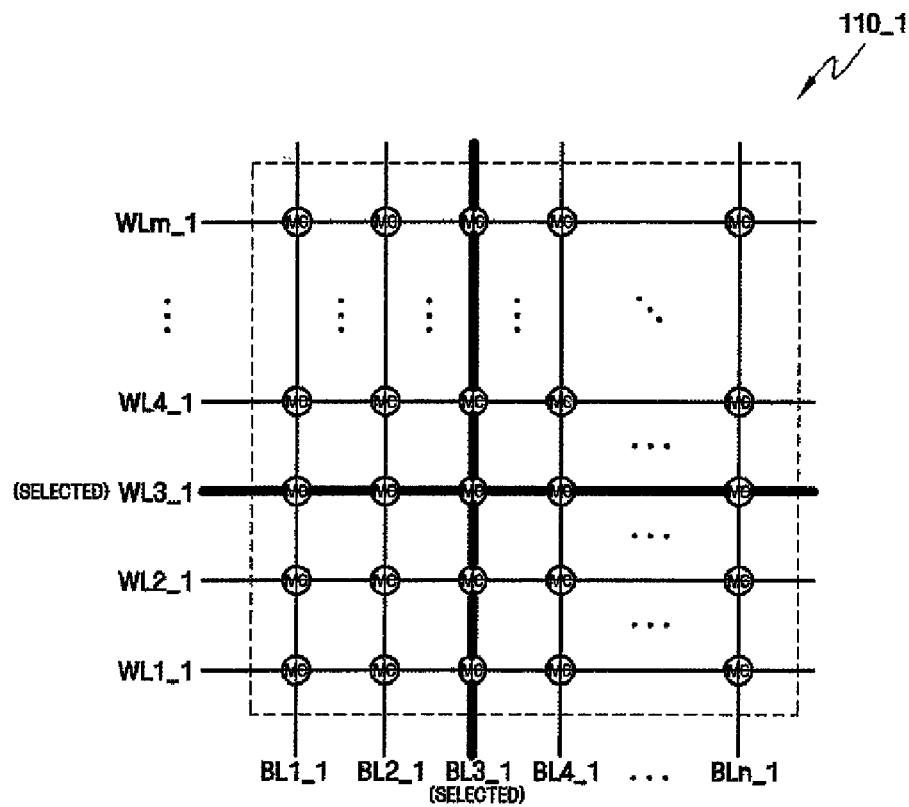
Figure 10:
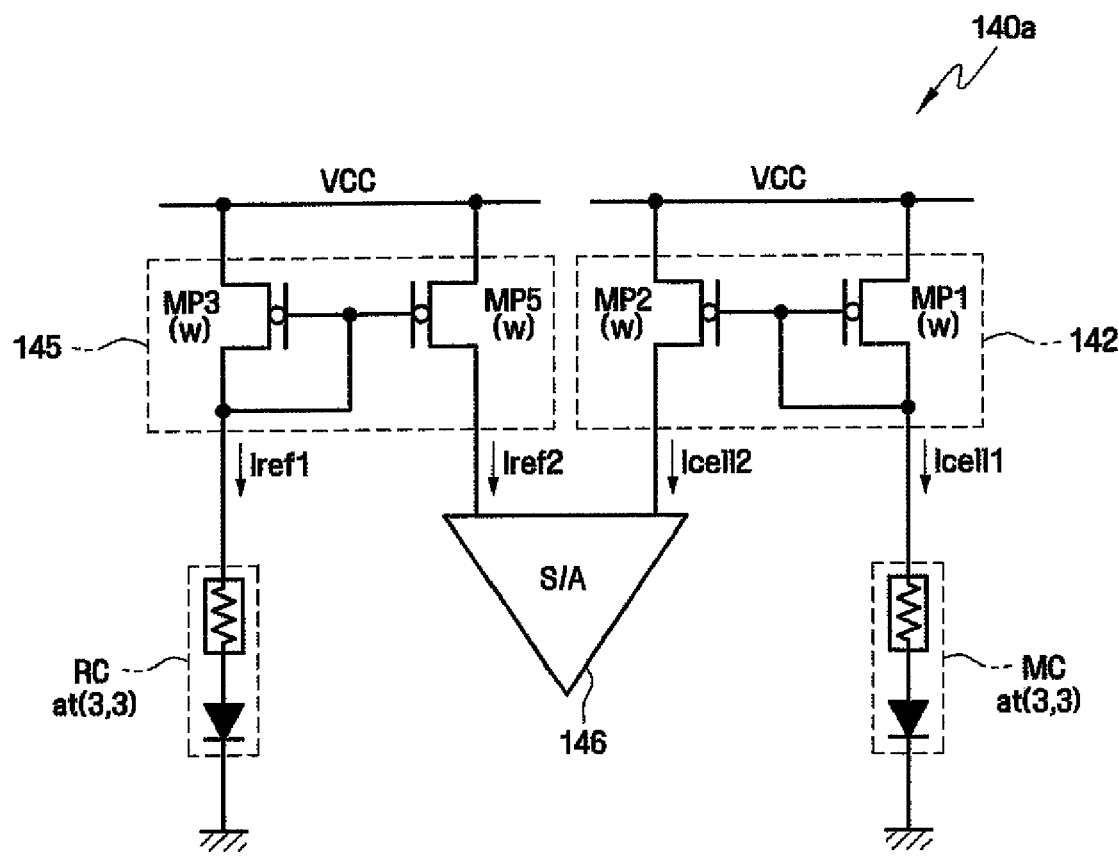
FIG. 10 is a circuit diagram illustrating a read circuit used in a nonvolatile memory device, according to another embodiment of the present invention.

FIG. 9 is a conceptual diagram illustrating a nonvolatile memory device according to another illustrative embodiment of the present invention. FIG. 9 illustrates a method of selecting a reference cell that corresponds to a selected nonvolatile memory cell, when reference data stored in a reference cell layer is the same as shown in FIG. 5C. FIG. 10 is a circuit diagram illustrating a read circuit used in the nonvolatile memory device according to the embodiment depicted in FIG. 9, for example.

Referring to FIG. 9, when multiple third reference cells storing reference data of a third resistance state (for example, the average resistance of the high resistance and the low resistance) are located in the reference cell layer 110_8, the row and column selection circuits 120 and 130 may select one of the third reference cells. Specifically, the row and column selection circuits 120 and 130 may select a nonvolatile memory cell located at the coordinates (x, y) (where x and y are natural numbers) from a memory cell layer (for example, memory cell layer 110_1), and select a reference cell located at the coordinates (x, y) from the reference cell layer 110_8. For example, as shown in FIG. 9, when the row and column selection circuits 120 and 130 select a nonvolatile memory cell MC located at the coordinates (3, 3) from the memory cell layer 110_1, the row and column selection circuits 120 and 130 may select a reference cell RC located at the coordinates (3, 3) from the reference cell layer 110_8.

In this case, it can understood that the coordinates of the nonvolatile memory cell MC selected from the memory cell layers 110_1 to 110_7 are the same as the coordinates of the first and second reference cells RC selected from the reference cell layer 110_8. As described above, this enables the sensing margin to be increased. However, when the sensing margin is sufficiently increased, the coordinates of the reference cell RC in the reference cell layer 110_8 and the coordinates of the nonvolatile memory cell MC in the memory cell layers 110_1 to 110_7 are not necessarily set to be equal to each other.

Referring to FIG. 10, a read circuit 140a includes a first current mirror circuit 142, a second current mirror circuit 145, and a sense amplifier 146. The read circuit 140a shown in FIG. 10 has substantially the same structure as that of the read circuit 140 shown in FIG. 7, except for the structure of the second current mirror circuit 145.

The second current mirror circuit 145 includes a third current path Iref1 coupled to the selected reference cell RC and a fourth current path Iref2 coupled to the sense amplifier 146. A PMOS transistor MP5 on the fourth current path Iref2 and a PMOS transistor MP3 on the third current path Iref1 may be the same in current driving capability and size, which means generally that a width W of the PMOS transistor MP5 is the same as a width W of the PMOS transistors MP3. The read circuit 140a may thus provide a comparison between a first bias level varying according to a cell current flowing through the selected nonvolatile memory cell MC and a second bias level varying according to a cell current flowing through the selected reference cell RC.

According to the nonvolatile memory device using resistive elements according to embodiments of the present invention as described above, coordinates of the reference cell(s) selected from the reference cell layer are set to be the same as or similar to the coordinates of the selected nonvolatile memory cell, so as to increase a sensing margin. The reliability of a read operation can thus be improved.

Although the present invention has been described with reference to exemplary embodiments, it will be apparent to those skilled in the art that various modifications and changes may be made without departing from the spirit and scope of the present invention. Therefore, it should be understood that the above embodiments are not limiting, but illustrative in all aspects.

What is claimed is:

1. A nonvolatile memory device comprising:
   a stack-type memory cell array comprising a plurality of memory cell layers and a reference cell layer that are vertically laminated, each memory cell layer comprising a plurality of nonvolatile memory cells for storing data and the reference cell layer comprising a plurality of reference cells for storing reference data;
   a selection circuit for selecting a nonvolatile memory.cell from the plurality of memory cell layers and at least one reference cell, corresponding to the selected nonvolatile memory cell, from the reference cell layer; and
   a read circuit for supplying a read bias to each of the selected nonvolatile memory cell and the selected reference cell corresponding to the selected nonvolatile memory cell, and for reading data from the selected nonvolatile memory cell.

2. The nonvolatile memory device of claim 1, wherein the reference cell layer comprises:
   a plurality of first reference cells for storing first reference data having a first resistance state; and
   a plurality of second reference cells for storing second reference data having a second resistance state.

3. The nonvolatile memory device of claim 2, wherein the selection circuit selects one of the plurality of first reference cells and one of the plurality of second reference cells corresponding to the selected nonvolatile memory cell.

4. The nonvolatile memory device of claim 3, wherein the selected nonvolatile memory cell comprises first coordinates in a memory cell layer of the plurality of memory cell layers, and wherein the selected first reference cell comprises the first coordinates in the reference cell layer and the selected second reference cell comprises second coordinates different from the first coordinates in the reference cell layer, such that first reference data stored in the selected first reference cell is different from second reference data stored in the second reference cell.

5. The nonvolatile memory device of claim 2, wherein the plurality of first reference cells and the plurality of second reference cells are arranged in a checkerboard pattern.

6. The nonvolatile memory device of claim 5, wherein the selected nonvolatile memory cell has coordinates (x, y) (where x and y are natural numbers) in one of the plurality of memory cell layers, and wherein the selected at least one reference cell includes a first reference cell having the coordinates (x, y) and a second reference cell having coordinates (x+1, y) or (x−1, y) in the reference cell layer.

7. The nonvolatile memory device of claim 5, wherein the selected nonvolatile memory cell has coordinates (x, y) (where x and y are natural numbers) in one of the plurality of memory cell layers, and wherein the selected at least one reference cell includes a first reference cell having the coordinates (x, y) and a second reference cell having coordinates (x, y+1) or (x, y−1) in the reference cell layer.

8. The nonvolatile memory device of claim 1, wherein the reference cell layer comprises a plurality of reference cells for storing reference data having a third resistance state.

9. The nonvolatile memory device of claim 8, wherein the selected nonvolatile memory cell has coordinates (x, y) (where x and y are natural numbers) in one of the plurality of memory cell layers, and wherein the selected at least one reference cell has the coordinates (x, y) in the reference cell layer.

10. The nonvolatile memory device of claim 1, wherein the reference cell layer is located between two of the plurality of memory cell layers.

11. The nonvolatile memory device of claim 1, wherein the read circuit compares a first bias level varying according to a cell current flowing through the selected nonvolatile memory cell and a second bias level varying according to a cell current flowing through the selected at least one reference cell, and outputs the compared result.

12. The nonvolatile memory device of claim 11, wherein the selection circuit selects one of a plurality of first reference cells storing first reference data having a first resistance state and one of a plurality of second reference cells storing second reference data having a second resistance state, and wherein the cell current flowing through the selected at least one reference cell comprises a sum of a first cell current flowing through the selected first reference cell and a second cell current flowing through the selected second reference cell.

13. The nonvolatile memory device of claim 11, wherein the read circuit comprises:

a first current mirror circuit coupled to the selected nonvolatile memory cell;

a second current mirror circuit coupled to the selected at least one reference cell; and a sense amplifier coupled to the first current mirror circuit and the second current mirror circuit.

14. The nonvolatile memory device of claim 1, wherein each of the plurality of nonvolatile memory cells comprises a resistive memory cell.

15. The nonvolatile memory device of claim 1, wherein each of the plurality of memory cell layers and the reference cell layer comprises a cross point structure.

16. A nonvolatile memory device comprising:

a memory cell array comprising a plurality of memory cell layers and a reference cell layer the plurality of memory cell layers and the reference cell layer being vertically laminated, wherein the plurality of memory cell layers comprise a plurality of nonvolatile memory cells for storing data, and the reference cell layer comprises a plurality of first reference cells for storing first reference data having a first resistance state and a plurality of second reference cells for storing second reference data having a second resistance state;

a selection circuit for selecting a nonvolatile memory cell from the plurality of nonvolatile memory cells, and for selecting a first reference cell from the plurality of first reference cells and a second reference cell from the plurality of second reference cells; and a read circuit for supplying a read bias to each of the selected nonvolatile memory cell, the selected first reference cell and the selected second reference cell, and for reading data from the selected nonvolatile memory cell.

17. The nonvolatile memory device of claim 16, wherein the read circuit compares a first bias level varying according to a cell current flowing through the selected nonvolatile memory cell and a second bias level varying according to a combined cell current flowing through the selected first reference cell and the selected second reference cell, and outputs the comparison.

18. The nonvolatile memory device of claim 17, wherein the read circuit comprises:

a first current mirror circuit coupled to the selected nonvolatile memory cell;

a second current mirror circuit coupled to the selected first reference cell and the selected second reference cell; and a sense amplifier coupled to the first current mirror circuit and the second current mirror circuit.

19. The nonvolatile memory device of claim 16, wherein each of the plurality of memory cell layers and the reference cell layer comprises a cross point structure.

* * * * *